(12) United States Patent
Liu et al.

(10) Patent No.: US 10,568,211 B2
(45) Date of Patent: Feb. 18, 2020

(54) RESIN COMPOSITION AND USES OF THE SAME

(71) Applicant: TAIWAN UNION TECHNOLOGY CORPORATION, Chupei, Hsinchu County (TW)

(72) Inventors: Shur-Fen Liu, Chupei (TW); Meng-Huei Chen, Chupei (TW)

(73) Assignee: TAIWAN UNION TECHNOLOGY CORPORATION, Chupei, Hsinchu County (TW)

( * ) Notice: Subject to any disclaimer, the term of this patent is extended or adjusted under 35 U.S.C. 154(b) by 381 days.

(21) Appl. No.: 14/808,364

(22) Filed: Jul. 24, 2015

(65) Prior Publication Data
US 2016/0297988 A1 Oct. 13, 2016

(30) Foreign Application Priority Data
Apr. 10, 2015 (TW) .............................. 104111596 A

(51) Int. Cl.
| C08J 5/24 | (2006.01) |
| C08G 65/48 | (2006.01) |
| C08K 5/00 | (2006.01) |
| C08G 65/44 | (2006.01) |
| C08K 5/3492 | (2006.01) |
| C08K 5/5313 | (2006.01) |
| H05K 3/00 | (2006.01) |
| H05K 1/03 | (2006.01) |
| H05K 3/02 | (2006.01) |

(52) U.S. Cl.
CPC .......... *H05K 3/0011* (2013.01); *C08G 65/44* (2013.01); *C08G 65/485* (2013.01); *C08J 5/24* (2013.01); *C08K 5/0025* (2013.01); *H05K 1/0373* (2013.01); *C08J 2371/12* (2013.01); *C08K 5/0091* (2013.01); *C08K 5/34924* (2013.01); *C08K 5/5313* (2013.01); *H05K 1/0366* (2013.01); *H05K 3/022* (2013.01)

(58) Field of Classification Search
CPC .......... C08L 71/126; C08L 71/12; C08L 9/00; C08L 9/06; C08G 65/485
See application file for complete search history.

(56) References Cited

U.S. PATENT DOCUMENTS

| 7,495,047 B2* | 2/2009 | Peters ................... C08K 5/0008 524/136 |
| 2010/0307803 A1* | 12/2010 | Paul ........................ B32B 7/12 174/257 |
| 2014/0044918 A1* | 2/2014 | Zeng ........................ C08L 47/00 428/141 |
| 2014/0322545 A1* | 10/2014 | Yang ..................... H05K 1/0366 428/426 |
| 2015/0166788 A1 | 6/2015 | Li et al. |
| 2015/0257263 A1* | 9/2015 | Sethumadhavan .. H05K 1/0366 257/88 |
| 2016/0060429 A1* | 3/2016 | Kitai .......................... C08K 5/49 174/258 |

FOREIGN PATENT DOCUMENTS

| CN | 103709717 A | 4/2014 | |
| TW | 201433590 A * | 9/2014 | ............. C08G 65/48 |

OTHER PUBLICATIONS

TAIC Product Information, Nippon Kasei Chemical Co., Ltd, downloaded from www.nkchemical.co.jp on Sep. 11, 2017.*
Machine translation by Google (TM) of TW201433590A, published Sep. 1, 2014. (Year: 2014).*
Taiwanese Office Action issued by the Taiwan Intellectual Property Office dated Aug. 21, 2015, for the TW patent Application No. 104111596.

* cited by examiner

*Primary Examiner* — Monique R Jackson
(74) *Attorney, Agent, or Firm* — Cantor Colburn LLP

(57) ABSTRACT

A resin composition, comprising:
(a) a resin of formula (I):

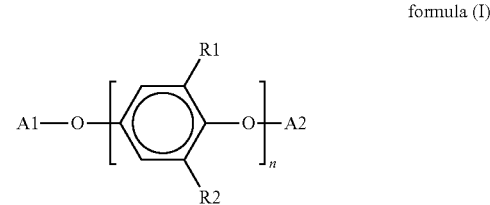

formula (I)

(b) triallyl isocyanurate (TAIC) as a first hardener; and
(c) a hardening promoter, which is a metallic salt compound of formula (II):

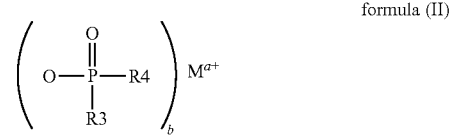

formula (II)

wherein, R1, R2, R3, R4, A1, A2, $M^{a+}$, b, and n are as defined in the specification, and wherein the weight ratio of the resin (a) to the first hardener (b) is about 10:1 to about 1:1, and the content of the hardening promoter (c) is about 0.1 wt % to less than 15 wt % based on the total weight of the resin (a) and the first hardener (b), and the weight ratio of the resin (a) to the total amount of the first hardener (b) and BMI is not lower than 1:1.

16 Claims, No Drawings

RESIN COMPOSITION AND USES OF THE SAME

CROSS REFERENCE TO RELATED APPLICATIONS

The present invention claims priority under 35 U.S.C. § 119 to Taiwan Patent Application No. 104111596 filed on Apr. 10, 2015, the entire content of which is incorporated herein by reference.

BACKGROUND OF THE INVENTION

Field of the Invention

The present invention relates to a resin composition, especially a polyphenylene ether-based resin composition comprising a polyphenylene ether resin, triallyl isocyanurate (TAIC), and a metallic salt oxide as a hardening promoter. The present invention also relates to a prepreg and laminate provided by using the same.

Descriptions of the Related Art

Printed circuit boards (PCBs) are circuit substrates that are used for electronic devices to load other electronic components and to electrically connect the components to provide a stable circuit working environment. One kind of conventional printed circuit board is a copper clad laminate (CCL), which is primarily composed of resin(s), reinforcing material(s) and copper foil(s). Conventional resins include epoxy resins, phenolic resin, polyamine formaldehyde resins, silicone resins or polytetrafluoroethylene resins; and conventional reinforcing materials include glass fiber cloths, glass fiber mats, insulating papers or linen cloths.

In general, a printed circuit board can be prepared by using the following method: immersing a reinforcing material, such as glass fiber fabric into a resin (such as epoxy resin), and curing the immersed glass fiber fabric into a half-hardened state, i.e., B-stage, to obtain a prepreg; superimposing certain layers of the prepregs and superimposing a metal foil on at least one external surface of the superimposed prepregs to provide a superimposed object; hot-pressing the superimposed object, i.e., C-stage, to obtain a metal clad laminate; etching the metal foil on the surface of the metal clad laminate to form a defined circuit pattern; and finally, drilling a plurality of holes on the metal clad laminate and plating these holes with a conductive material to form via holes to accomplish the preparation of the printed circuit board.

Laminates prepared by using an epoxy resin may be provided with proper physicochemical properties such as heat resistance, chemical stability, mechanical strength, etc. However, laminates thus prepared are also provided with a high dielectric constant (Dk), high dissipation factor (Df), and high water absorption rate, which all lead to the deterioration of the signal transmission quality (e.g., a slow signal transmission rate and signal loss). As a result, the laminates prepared by using an epoxy resin fail to meet the requirements for high frequency and high-speed signal transmission for smaller, lighter, and thinner electronic products.

Polyphenylene ether resin is another resin material for preparing laminates. In general, polyphenylene ether resin is poor in heat resistance (high temperature stability) but has excellent electrical properties and good chemical resistance (e.g., corrosion resistance, acid and alkali resistance), and thus, is usually used in combination with epoxy resin to improve electrical properties. However, in practical use, the compatibility between polyphenylene ether resin and epoxy resin is poor due to the difference in the polarity of their chemical structures. The incompatibility makes it difficult to process the resin composition and thus, limits the usage of the resin composition. In addition, it is difficult to produce the advantage of polyphenylene ether resin in the resin composition well.

In view of this, the present invention provides a polyphenylene-based resin composition. Laminates prepared by using the resin composition of the present invention are provided with satisfactory physicochemical properties and an excellent peeling strength in particular.

SUMMARY OF THE INVENTION

An objective of the present invention is to provide a resin composition, comprising:
(a) a resin of the following formula (I);

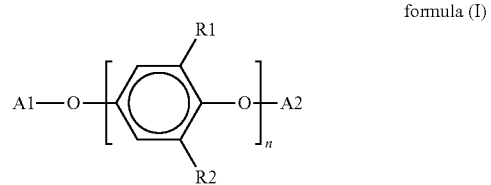

formula (I)

(b) triallyl isocyanurate (TAIC) as a first hardener; and
(c) a hardening promoter, which is a metallic salt compound of the following formula (II),

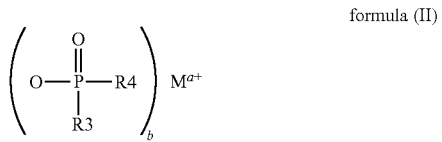

formula (II)

wherein,
R1 and R2 are independently H or substituted or unsubstituted C1-C10 alkyl;
A1 and A2 are independently a group with vinyl or allyl;
n is an integer from 5 to 30;
R3 and R4 are independently C1-C5 alkyl;
$M^{a+}$ is a metal ion selected from the group consisting $Al^{3+}$, $Zn^{2+}$, $Ca^{2+}$, $Ti^{4+}$, $Mg^{2+}$, $Sr^{2+}$, $Ba^{2+}$, $K^+$ and $Cu^{2+}$; and
b is an integer from 1 to 4,
and wherein, the weight ratio of the resin (a) to the first hardener (b) is about 10:1 to about 1:1,
and the amount of the hardening promoter (c) is about 0.1 wt % to less than 15 wt % based on the total weight of the resin (a) and the first hardener (b).

Another objective of the present invention is to provide a prepreg, which is prepared by immersing a substrate into the resin composition described above, and drying the immersed substrate.

Yet another objective of the present invention is to provide a laminate, comprising a synthetic layer and a metal layer, wherein the synthetic layer is made from the prepreg described above.

To render the above objectives, technical features and advantages of the present invention more apparent, the present invention will be described in detail with reference to some embodiments hereinafter.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification. Furthermore, for clarity, the size of each element and each area may be exaggerated in the appended drawings and not depicted in actual proportion. Unless it is additionally explained, the expressions "a," "the," or the like recited in the specification of the present invention (especially in the claims) should include both the singular and the plural forms. Furthermore, unless it is additionally explained, while describing the constituents in the solution, mixture and composition in the specification, the amount of each constituent is measured based on the solid content, i.e., regardless of the weight of the solvent.

The present invention provides a polyphenylene ether-based resin composition, which uses a polyphenylene ether resin with a specific structure, and uses triallyl isocyanurate (TAIC) in combination with a specific metallic salt compound in a specific ratio. Laminates prepared thereby can be provided with satisfactory physicochemical properties (such as water absorption, solder resistance, Dk and Df) and an excellent peeling strength in particular.

Specifically, the resin composition of the present invention comprises (a) a resin of the following formula (I), (b) triallyl isocyanurate (TAIC) as a first hardener; and (c) a hardening promoter, which is a metallic salt compound of the following formula (II).

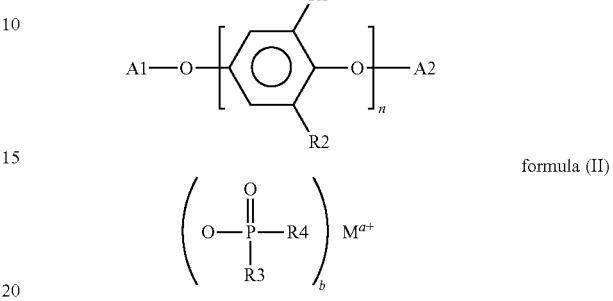

In formula (I), R1 and R2 are independently H or substituted or unsubstituted C1-C10 alkyl, such as methyl, ethyl, n-propyl, isopropyl, n-butyl, isobutyl, n-pentyl, isopentyl, n-hexyl, isohexyl, n-heptyl, n-octyl, 2-ethylhexyl, n-nonyl, n-decyl, and the like; A1 and A2 are independently a group having vinyl or allyl; and n is an integer from 5 to 30. Preferably, R1 and R2 are independently H or substituted or unsubstituted methyl, and A1 and A2 are independently a group selected from the group consisting of

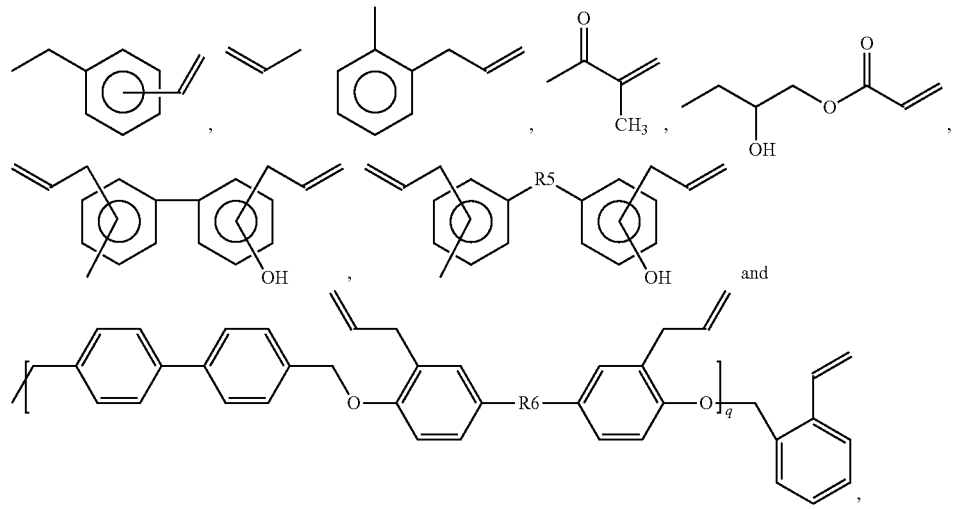

wherein R5 and R6 are independently —O—, —SO$_2$—, or —C(CH$_3$)$_2$—, and q is an integer, wherein 0<q≤15, preferably 1<q≤10, and more preferably 1<q<5. In some embodiments of the present invention, R1 and R2 are methyl, A1 and A2 are

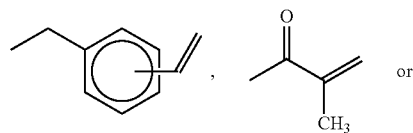

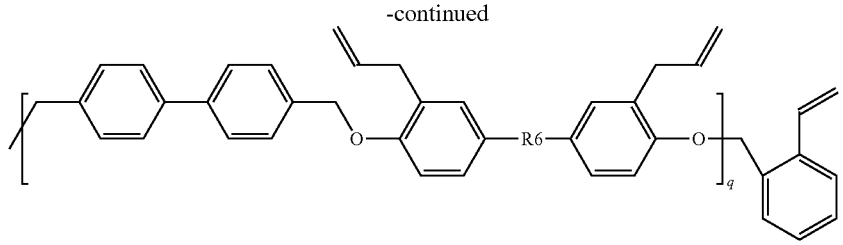

In addition, in formula (II), R3 and R4 are independently C1-C5 alkyl; $M^{a+}$ is a metal ion selected from the group consisting of $Al^{3+}$, $Zn^{2+}$, $Ca^{2+}$, $Ti^{4+}$, $Mg^{2+}$, $Sr^{2+}$, $Ba^{2+}$, $K^+$ and $Cu^{2+}$; and b is an integer from 1 to 4. In some embodiments of the present invention, R3 and R4 are ethyl, $M^{a+}$ is $Al^{3+}$, and b is 3.

In the resin composition of the present invention, triallyl isocyanurate (TAIC) plays a role of a hardener, which makes the resin composition form an interpenetrating polymer network (IPN) to further improve the physicochemical properties and electrical properties of the laminate thus prepared (such as high Tg, low water absorption and low Df). The "IPN structure" means a network structure formed from two or more polymers where the molecular chains interpenetrate each other and crosslink with chemical bonds. In addition to TAIC, the resin composition of the present invention may further comprise a conventional hardener as a second hardener. The types of the described "conventional hardener" are not particularly limited. For example, the conventional hardener may be one or more selected from the group consisting of bismaleimide (BMI), phenolic resin (e.g., phenolic resin having allyl) and styrene maleic anhydride (SMA) resin. In some embodiments of the present invention, BMI of the following formula (III) as the second hardener is further comprised:

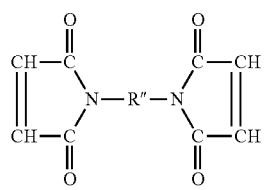

formula (III)

wherein, R" is substituted or unsubstituted methylene, 4,4'-diphenylmethane, m-phenylene, bisphenol A diphenyl ether, 3,3'-dimethyl-5,5'-diethyl-4,4'-diphenyl methane, 4-methyl-1,3-phenylene, or (2,2,4-trimethyl)hexane. Preferably, R" is selected from the group consisting of —CH$_2$—,

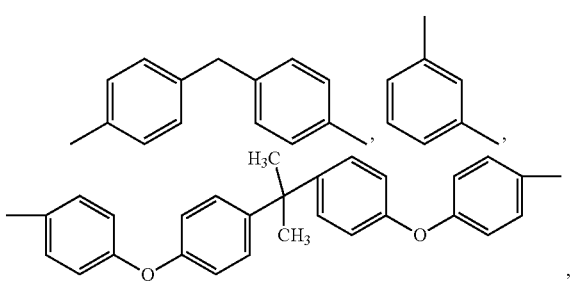

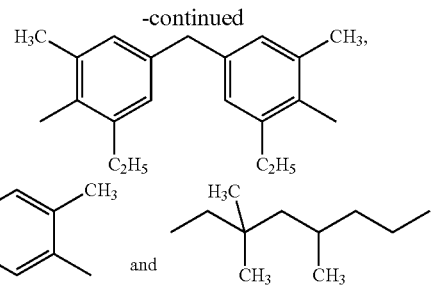

In some of the appended examples of the present specification, a BMI with a structure of formula (III) where R" is

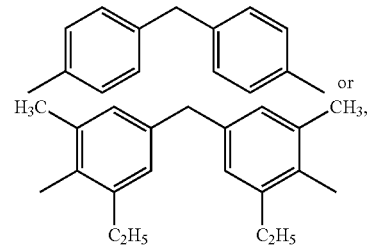

is used as the second hardener. As shown in the records of the examples, the embodiments using TAIC in combination with BMI can obtain further improvements in physicochemical properties (e.g., in peeling strength).

As described above, one technical feature of the present invention lies in combining the resin (a), the first hardener (b) and the hardening promoter (c) in a specific ratio to achieve the inventive efficacy. In the resin composition of the present invention, the weight ratio of the resin (a) to the first hardener (b) is about 10:1 to about 1:1, preferably about 4:1 to about 1:1. If the ratio of the resin (a) to the first hardener (b) is too high (i.e., too few hardener), for example, higher than 10:1, a desired hardening effect may not be provided, such that the mechanical properties and physicochemical properties of the material thus provided become poor. In addition, if the ratio of the resin (a) to the first hardener (b) is too low (i.e., too much hardener), for example, lower than 1:1, inherent excellent properties of the polyphenylene ether resin (a) may not be maintained. Furthermore, in the embodiments in which the resin composition of the present invention further comprises other conventional hardener(s) as the second hardener, the mixing ratio of the first hardener (b) to the second hardener is not particularly limited and can be adjusted depending on the needs of users. However, it should be noted that the amount ratio of the resin (a) to the overall hardener components should not be too low, for example, lower than 1:1, otherwise the inherent excellent properties of the polyphenylene ether resin (a) may be affected.

It is believed that the metallic salt compound with a structure of formula (II) can promote the hardening of the polyphenylene ether-based resin composition of the present invention, such that the laminate prepared therefrom is provided with outstanding electrical properties and mechanical properties as well as excellent solder resistance. Particularly, under a specific amount, the metallic salt compound can make the prepared laminate with excellent peeling strength (reaching 3.6 pounds/inch or more). Therefore, in the resin composition of the present invention, the amount of the hardening promoter (c) is about 0.1 wt % to less than 15 wt %, and preferably about 5 wt % to about 10 wt %, based on the total weight of the resin (a) and the first hardener (b). If the amount of the hardening promoter (c) is too low (e.g., lower than 0.1 wt %) or the resin composition contains no hardening promoter (c), all the electrical properties and mechanical properties of the prepared laminate (especially solder resistance, Tg) become significantly poor. In addition, if the amount of the hardening promoter (c) exceeds the specified range either above or below, the peeling strength of the prepared laminate is negatively affected.

The resin composition of the present invention may optionally further comprise other additives, such as an elastomer, a catalyst, a flame retardant, a filler, a dispersing agent, a flexibilizer and the like, and those additives may be taken alone or in combination. An elastomer can be added to further improve the electrical properties and the physico-chemical properties of materials. A catalyst can be added to promote the reaction involved. A filler can be added to improve the ease of processing, heat resistance and/or moisture resistance of a material. A flame retardant can be added to increase the flame retardance of the prepared material. A hardening promoter can be added to improve the hardening effect. The elastomer may be selected from the group consisting of polybutadiene, polyisoprene, a styryl-containing polymer and combinations thereof, but is not limited thereto. The catalyst may be an organic peroxide selected from the group consisting of dicumyl peroxide (DCP), α,α'-bis(t-butylperoxy)diisopropyl benzene, benzoyl peroxide (BPO) and combinations thereof, but is not limited thereto. The flame retardant may be a phosphorus-containing flame retardant or a bromine-containing flame retardant (e.g., decabromobibenzyl ethane, DBDPE), but is not limited thereto. The filler may be selected from the group consisting of silica, glass powder, talcum powder, kaolin, pryan, mica, inorganic metal oxides (e.g., aluminum oxide, zirconium oxide) and combinations thereof, but is not limited thereto.

As for the amount of each of the additives, it is not particularly limited and can be adjusted depending on the needs by persons with ordinary skill in the art in accordance with their ordinary skill and the disclosure of the present specification.

The resin composition of the present invention may be prepared into varnish form by evenly mixing the resin (a), the first hardener (b), and the hardening promoter (c) through the stirrer and dissolving or dispersing the obtained mixture into a solvent, for subsequent applications. The solvent here can be any inert solvent which can dissolve (or disperse) but not react with the components of the resin composition of the present invention. Examples of the solvent which can dissolve or disperse the resin composition of the present invention include toluene, γ-butyrolactone, methyl ethyl ketone, cyclohexanone, butanone, acetone, xylene, methyl isobutyl ketone, N,N-dimethyl formamide (DMF), N,N-dimethyl acetamide (DMAc), N-methyl-pyrolidone (NMP), and mixtures thereof, but is not limited thereto. The amount of the solvent is not particularly limited as long as the components of the resin composition can be evenly mixed. In some embodiments of the present invention, a mixture of toluene and γ-butyrolactone is used as the solvent, and the amount of the solvent is about 20 parts by weight to about 80 parts by weight based on 100 parts by weight of the total weight of the resin (a), the first hardener (b), and the hardening promoter (c).

The present invention further provides a prepreg which is obtained by adhering the abovementioned resin composition to a substrate (a reinforcing material) surface completely and drying the adhered substrate. A conventional reinforcing material includes a glass fiber cloth (a glass fabric, a glass paper, a glass mat, etc.), a kraft paper, a short fiber cotton paper, a nature fiber cloth, an organic fiber cloth, etc. In some embodiments of the present invention, 1080 glass fiber cloths are illustrated as the reinforcing materials, and the reinforcing materials are heated and dried at 175° C. for 2 to 15 minutes (B-stage) to provide half-hardened prepregs.

The abovementioned prepregs can be used for manufacturing laminates. Thus, the present invention further provides a laminate comprising a synthetic layer and a metal layer, wherein the synthetic layer is made from the above prepregs. The laminate may be prepared by the following process: superimposing a plurality of prepregs and superimposing a metal foil (such as a copper foil) on at least one external surface of the superimposed prepregs to provide a superimposed object; performing a hot-pressing operation onto the superimposed object to obtain the laminate. Moreover, a printed circuit board can be obtained by further patterning the metal foil of the laminate.

The present invention will be further illustrated by the embodiments hereinafter, wherein the measuring instruments and methods are respectively as follows:

[Water Absorption Test]

The moisture resistance of the laminate is tested by pressure cooker test (PCT), i.e., subjecting the laminate into a pressure container (121° C., 100% R.H. and 1.2 atm) for 2 hours.

[Solder Resistance Test]

The solder resistance test is carried out by immersing the dried laminate in a solder bath at 288° C. for a while and observing whether there is any defect such as delamination and expansion.

[Peeling Strength Test]

Peeling strength refers to the bonding strength between the metal foil and laminated prepreg, and which is usually expressed by the force required for vertically peeling the clad copper foil with a width of ⅛ inch from the surface of the laminated prepreg.

[Glass Transition Temperature (Tg) Test]

Glass transition temperature (Tg) is measured by using a Differential Scanning calorimeter (DSC), wherein the measuring methods are IPC-TM-650.2.4.25C and 24C testing method of the Institute for Interconnecting and Packaging Electronic Circuits (IPC).

[Flame Retardance Test]

The flame retardance test is carried out according to UL94V (Vertical Burn), which comprises the burning of a laminate, which is held vertically, using a Bunsen burner to compare its self-extinguishing properties and combustion-supporting properties.

[Dielectric Constant and Dissipation Factor Measurement]

Dk and Df are measured according to ASTM D150 under an operating frequency of 10 GHz.

EXAMPLE

Example 1

According to the ratio shown in Table 1, polyphenylene ether resin (a) of formula (I) (R1 and R2 are methyl, A1 and A2 are

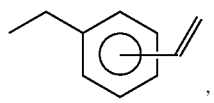

and n is an integer from 5 to 30, available from Mitsubishi Company), triallyl isocyanurate (TAIC, available from Evonik Company) as the first hardener (b), metallic salt compound (R3 and R4 are ethyl, $M^{a+}$ is $Al^{3+}$, and b is 3, trade name: OP935, available from Clariant Company) as the hardening promoter, decabromobibenzyl ethane (trade name: SAYTEX 8010, available from Albemarle Company) as the flame retardant, and silica powder (available from Denka Company) as the filler were mixed under room temperature with a stirrer for about 60 minutes followed by adding toluene and γ-butyrolactone (both available from Fluka Company) thereinto. After stirring the resultant mixture under room temperature for about 120 minutes, resin composition 1 was obtained.

Example 2

The preparation procedures of Example 1 were repeated to prepare resin composition 2, except that SPB 100 (available from Otsuka Chemical Company) was added as the flame retardant, and the amount of the hardening promoter was adjusted as shown in Table 1.

Example 3

The preparation procedures of Example 2 were repeated to prepare resin composition 3, except that a polyphenylene ether resin of formula (I) available from Sabic Company (R1 and R2 are methyl, A1 and A2 are

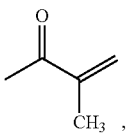

and n is an integer from 5 to 30; trade name: SA9000) was added as the resin (a), bismaleimide of the aforementioned formula (III) (R" is

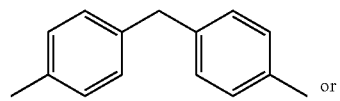

or

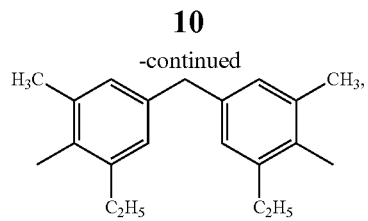

available from Daiwakasei Company) was further added as a second hardener, benzoyl peroxide (available from Fluka Company) was further added as the catalyst, and the amounts of the first hardener (b), the hardening promoter, the flame retardant, and the filler were adjusted as shown in Table 1.

Example 4

The preparation procedures of Example 3 were repeated to prepare resin composition 4, except that the homopolymer of butadiene (trade name: Ricon 130, available from CRAY VALLEY Company) was further added as the elastomer, and the amounts of the first hardener (b), the hardening promoter, bismaleimide, benzoyl peroxide and the filler were adjusted as shown in Table 1.

Comparative Example 1

The preparation procedures of Example 1 were repeated to prepare comparative resin composition 1, except that the polyphenylene ether resin identical to that of Example 3 was used as resin (a), the hardening promoter was not added, benzoyl peroxide was further added as the catalyst, and the amounts of the first hardener (b) and the filler were adjusted as shown in Table 1.

Comparative Example 2

The preparation procedures of Example 1 were repeated to prepare comparative resin composition 2, except that the amount of the hardening promoter was adjusted to be outside the specified range according to the present invention, and the homopolymer of butadiene was further added as the elastomer as shown in Table 1.

Comparative Example 3

The preparation procedures of Example 1 were repeated to prepare comparative resin composition 3, except that the amount of the hardening promoter was adjusted to be outside the specified range according to the present invention as shown in Table 1.

Comparative Example 4

The preparation procedures of Example 4 were repeated to prepare comparative resin composition 4, except that the polyphenylene ether resin identical to that of Example 1 was used as the resin (a), the catalyst was not added, and the amount of the hardening promoter was adjusted to be outside the specified range a the present invention as shown in Table 1.

TABLE 1

| parts by weight | | Example 1 | Example 2 | Example 3 | Example 4 | Comparative Example 1 | Comparative Example 2 | Comparative Example 3 | Comparative Example 4 |
|---|---|---|---|---|---|---|---|---|---|
| resin (a) | polyphenylene ether resin | 60 | 60 | 60 | 60 | 60 | 60 | 60 | 60 |
| | source | M[note 1] | M | S[note 2] | S | S | M | M | M |
| first hardener (b) | TAIC | 20 | 20 | 15 | 20 | 19 | 17 | 18 | 21 |
| hardening promoter (c) | metallic salt oxide OP935 | 4 | 6.4 | 3.75 | 7.5 | 0 | 11.55 | 15.6 | 16.2 |
| second hardener | BMI | | | 10 | 11 | | | | 12 |
| elastomer | homopolymer of butadiene | | | | 7 | | 8 | | 7 |
| catalyst | peroxide | | | 0.2 | 0.1 | 0.3 | | | |
| flame retardant | SAYTEX 8010 | 15 | | | | 15 | 18.5 | 14.5 | |
| | SPB100 | | 13 | 14 | 14 | | | | 12 |
| filler | silica powder | 30 | 30 | 30.5 | 34 | 28.5 | 0 | 32.5 | 28.5 | note 1
"M" represents polyphenylene ether resin available from Mitsubishi Company note 2
"S" represents polyphenylene ether resin (trade name SA9000) available from Sabic Company

[Preparation of the Laminate]

Laminates 1 to 4 and comparative laminates 1 to 4 were prepared using the resin compositions 1 to 4 and comparative resin compositions 1 to 4, respectively. In detail, one of the resin compositions was coated on 1080 reinforced glass fiber cloths by a roller. The coated 1080 reinforced glass fiber cloths were then placed in an oven and dried at 175° C. for 2 to 15 minutes to produce prepregs in a half-hardened state (resin content: about 63%). Four pieces of the prepregs were superimposed and two sheets of copper foil (0.5 oz.) were respectively superimposed on the two external surfaces of the superimposed prepregs to provide a superimposed object. A hot-pressing operation was performed on each of the prepared objects to provide the laminates 1 to 4 (corresponding to the resin compositions 1 to 4, respectively) and comparative laminates 1 to 4 (corresponding to the comparative resin compositions 1 to 4, respectively). Herein, the hot-pressing conditions are as follows: raising the temperature to about 200° C. to 220° C. with a heating rate of 3.0° C./min, and hot-pressing for 180 minutes under the full pressure of 15 kg/cm$^2$ (initial pressure is 8 kg/cm$^2$) at said temperature.

The water absorption, solder resistance, peeling strength, glass transition temperature (Tg), flame retardance, dielectric constant (Dk), dissipation factor (Df) of the laminates 1 to 4 and comparative laminates 1 to 4 were analyzed and the results are tabulated in Table 2.

TABLE 2

| | unit | laminate 1 | laminate 2 | laminate 3 | laminate 4 | comparative laminate 1 | comparative laminate 2 | comparative laminate 3 | comparative laminate 4 |
|---|---|---|---|---|---|---|---|---|---|
| water absorption | % | 0.28 | 0.37 | 0.38 | 0.32 | 0.43 | 0.46 | 0.56 | 0.33 |
| solder resistance | minute | >10 | >10 | >10 | >10 | >6 | >10 | >10 | >10 |
| peeling strength | pound/inch | 3.75 | 3.71 | 3.89 | 3.93 | 3.03 | 2.62 | 2.55 | 3.52 |
| Tg | ° C. | 205 | 200 | 230 | 221 | 190 | 207 | 220 | 203 |
| flame retardance | UL grade | V0 | V0 | V0 | V0 | V0 | V0 | V0 | V0 |
| Dk | 10 GHz | 0.0042 | 0.0048 | 0.0046 | 0.0049 | 0.0053 | 0.0055 | 0.0056 | 0.0038 |
| Df | 10 GHz | 3.66 | 3.68 | 3.57 | 3.53 | 3.70 | 3.72 | 3.75 | 3.50 |

As shown in Table 2, the laminates 1 to 4 manufactured by using the resin compositions of the present invention are provided with satisfactory physicochemical properties and electrical properties (such as water absorption, flame retardance, Dk and Df), and outstanding heat resistance (high Tg, and excellent solder resistance). Thus, the resin composition of the present invention can be more extensively used. In particular, the comparison between Examples 1 to 4 and Comparative Examples 1 to 4 shows that if the resin composition does not contain the hardening promoter (c), the physicochemical properties of the laminates thus prepared will become poor (especially solder resistance and Tg); and if the amount of the hardening promoter (c) is outside the specified range according to the present invention, even if just the amount of the hardening promoter (c) has been increased, the inventive laminate with excellent peeling strength (3.6 pound/inch or more) will not be available.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:
(a) a resin of the following formula (I);

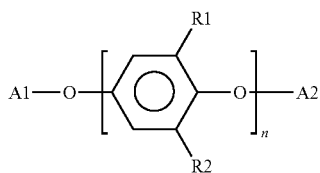

formula (I)

(b) triallyl isocyanurate (TAIC) as a first hardener;
(c) a hardening promoter, which is a metallic salt compound of the following formula (II),

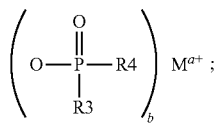

formula (II)

bismaleimide (BMI), which is a compound of the following formula (III):

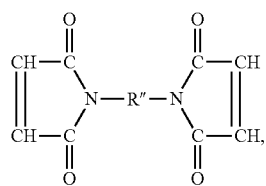

formula (III)

wherein in formula (III), R" is substituted or unsubstituted methylene, 4,4'-diphenylmethane, m-phenylene, bisphenol A diphenyl ether, 3,3'-dimethyl-5,5'-diethyl-4,4'-diphenyl methane, 4-methyl-1,3-phenylene, or (2,2,4-trimethyl)hexane, wherein in formulas (I) and (II), R1 and R2 are independently H or substituted or unsubstituted C1-C10 alkyl;

A1 and A2 are independently

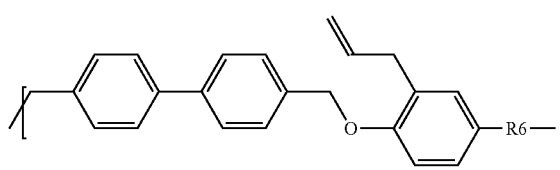

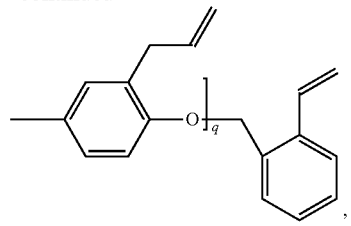

wherein R6 is —O—, —SO$_2$—, or —C(CH$_3$)$_2$—, and q is an integer, wherein 0<q≤15;
n is an integer from 5 to 30;
R3 and R4 are independently C1-C5 alkyl;
M$^{a+}$ is Al$^{3+}$ or Zn$^{2+}$; and
b is 2 or 3,
and wherein, the weight ratio of the resin (a) to the first hardener (b) is about 10:1 to about 1:1, and the amount of the hardening promoter (c) is about 0.1 wt % to less than 15 wt % based on the total weight of the resin (a) and the first hardener (b),
and wherein, the weight ratio of the resin (a) to the total amount of the first hardener (b) and BMI is not lower than 1:1.

2. The resin composition of claim 1, wherein R1 and R2 are independently H or substituted or unsubstituted methyl.

3. The resin composition of claim 2, wherein R1 and R2 are methyl.

4. The resin composition of claim 1, wherein R3 and R4 are ethyl, M$^{a+}$ is Al$^{3+}$, and b is 3.

5. The resin composition of claim 1, wherein the weight ratio of the resin (a) to the first hardener (b) is about 4:1 to about 1:1, and the amount of the hardening promoter (c) is about 5 wt % to about 10 wt % based on the total weight of the resin (a) and the first hardener (b).

6. The resin composition of claim 2, wherein the weight ratio of the resin (a) to the first hardener (b) is about 4:1 to about 1:1, and the amount of the hardening promoter (c) is about 5 wt % to about 10 wt % based on the total weight of the resin (a) and the first hardener (b).

7. The resin composition of claim 3, wherein the weight ratio of the resin (a) to the first hardener (b) is about 4:1 to about 1:1, and the amount of the hardening promoter (c) is about 5 wt % to about 10 wt % based on the total weight of the resin (a) and the first hardener (b).

8. The resin composition of claim 4, wherein the weight ratio of the resin (a) to the first hardener (b) is about 4:1 to about 1:1, and the amount of the hardening promoter (c) is about 5 wt % to about 10 wt % based on the total weight of the resin (a) and the first hardener (b).

9. The resin composition of claim 1, wherein R" is selected from the group consisting of —CH$_2$—,

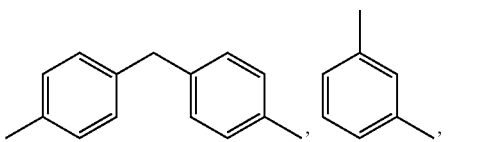

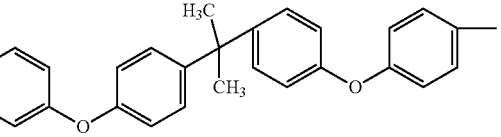

-continued

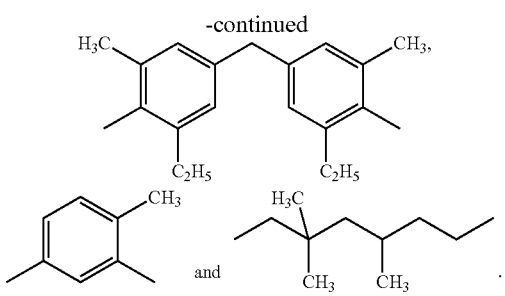

10. The resin composition of claim 1, further comprising an additive selected from the group consisting of an elastomer, a catalyst, a flame retardant, a filler, a dispersing agent, a flexibilizer and combinations thereof.

11. The resin composition of claim 10, wherein the elastomer is selected from the group consisting of polybutadiene, polyisoprene, a styryl-containing polymer and combinations thereof.

12. The resin composition of claim 10, wherein the catalyst is an organic peroxide selected from the group consisting of dicumyl peroxide (DCP), α,α'-bis(t-butylperoxy)diisopropyl benzene, Benzoyl Peroxide (BPO) and combinations thereof.

13. The resin composition of claim 10, wherein the flame retardant is a phosphorus-containing flame retardant or a bromine-containing flame retardant.

14. The resin composition of claim 10, wherein the filler is selected from the group consisting of silica, glass powder, talcum powder, kaolin, pryan, mica, inorganic metal oxides and combinations thereof.

15. A prepreg, which is prepared by immersing a substrate into the resin composition of claim 1, and drying the immersed substrate.

16. A laminate, comprising a synthetic layer and a metal layer, wherein the synthetic layer is made from the prepreg of claim 15.

* * * * *